US008006156B2

(12) United States Patent
Kojima (10) Patent No.: US 8,006,156 B2
(45) Date of Patent: Aug. 23, 2011

(54) METHOD OF GENERATING TEST CONDITION FOR DETECTING DELAY FAULTS IN SEMICONDUCTOR INTEGRATED CIRCUIT AND APPARATUS FOR GENERATING THE SAME

(75) Inventor: Hiromi Kojima, Chiba (JP)

(73) Assignee: Kawasaki Microelectronics, Inc., Chiba (JP)

( * ) Notice: Subject to any disclaimer, the term of this patent is extended or adjusted under 35 U.S.C. 154(b) by 179 days.

(21) Appl. No.: 12/453,612

(22) Filed: May 15, 2009

(65) Prior Publication Data
US 2009/0287974 A1    Nov. 19, 2009

(30) Foreign Application Priority Data

May 16, 2008 (JP) ................................. 2008-129494

(51) Int. Cl.
*G01R 31/28* (2006.01)
*G01R 35/00* (2006.01)
*G01R 31/00* (2006.01)
*G01R 31/08* (2006.01)
*G01R 31/26* (2006.01)
*G06F 17/50* (2006.01)
*G06F 11/30* (2006.01)

(52) U.S. Cl. .......... 714/741; 714/25; 714/724; 714/726; 714/729; 714/735; 714/744; 716/108; 716/112; 702/108; 702/117; 702/124; 702/185; 324/500; 324/528; 324/535; 324/762.01

(58) Field of Classification Search .................... 714/25, 714/724, 726, 729, 735, 741, 744; 716/108, 716/112; 324/500, 528, 535, 762.01; 702/108, 702/117, 124, 185
See application file for complete search history.

(56) References Cited

U.S. PATENT DOCUMENTS

| 6,401,227 | B1 * | 6/2002 | Yasue et al. .................... 714/744 |
| 6,708,139 | B2 * | 3/2004 | Rearick et al. ................ 702/185 |
| 7,120,890 | B2 | 10/2006 | Urata et al. |
| 7,546,500 | B2 * | 6/2009 | Kapur et al. .................. 714/726 |
| 7,797,601 | B2 * | 9/2010 | Kapur et al. .................. 714/726 |
| 2006/0001434 | A1 | 1/2006 | Hiramatsu et al. |
| 2007/0288822 | A1 * | 12/2007 | Lin et al. ....................... 714/741 |

OTHER PUBLICATIONS

Ahmed et al., A Novel Framework for Faster-than-at-Speed Delay Test Considering IR-Drop Effects, Nov. 5-9, 2006, ACM, pp. 1-6.*
Uzzaman et al., "Generating Faster-than-at-Speed Delay Tests with on Product Clock Generation", SOCcentral, May 1, 2005.
Putnam et al., "Enhanced Timing-Based Transition Delay Testing for Small Delay Defects", Proceedings of the 24$^{th}$ IEEE VLSI Test Symposium, Apr. 2006, p. 336-342.
Illman, "Use of Encounter Test for Low-Power, At-Speed ATPG", Cadence Design Systems, Inc., May 22, 2007. Nakamura et al., "Low Cost Delay Testing of Nanometer SoCs Using On-Chip Clocking and Test Compression", Proceedings of the 14$^{th}$ Asian Test Symposium, Dec. 2005, pp. 156-161.
"Kawasaki Micro Maximizes Delay Test Coverage with Latest Cadence Technology: Encounter True-Time Now Delivers Faster-Than-At-Speed Delay Test for Bridges and Through RAMs", Cadence Design Systems, Inc., San Jose, California, Nov. 7, 2005.

* cited by examiner

*Primary Examiner* — John J Tabone, Jr.
(74) *Attorney, Agent, or Firm* — Oliff & Berridge, PLC (57) ABSTRACT

Various exemplary embodiments provide methods and apparatuses for generating test conditions that efficiently detect delay faults while preventing overkill. According to an exemplary embodiment, i) test timing correcting block sets test timing faster than the actual operation timing of a logical circuit to be tested, ii) logical simulation block performs simulation by using delay times of signal paths corrected by adding minimum slack margin, and iii) when the simulation indicates that an end-side flip-flop cannot acquire data after an expected transition of logical value, masking block generates mask data that masks data held in the end-side flip-flop.

17 Claims, 8 Drawing Sheets

METHOD OF GENERATING TEST CONDITION FOR DETECTING DELAY FAULTS IN SEMICONDUCTOR INTEGRATED CIRCUIT AND APPARATUS FOR GENERATING THE SAME

This application claims priority from Japanese Application No. 2008-129494, filed on May 16, 2008, which is hereby incorporated by reference in its entirety.

BACKGROUND

This invention relates to methods of generating test conditions for detecting delay faults in semiconductor integrated circuit including logic circuits having a plurality of signal paths, and also relates to apparatuses for generating the same. This invention also relates to apparatuses for evaluating test conditions.

After the manufacturing, semiconductor integrated circuit products should be evaluated by conducting various tests so that only the products having operable logic circuits integrated therein may be selected and shipped. Delay test for detecting delay faults is one of the various tests.

Figure 5A:
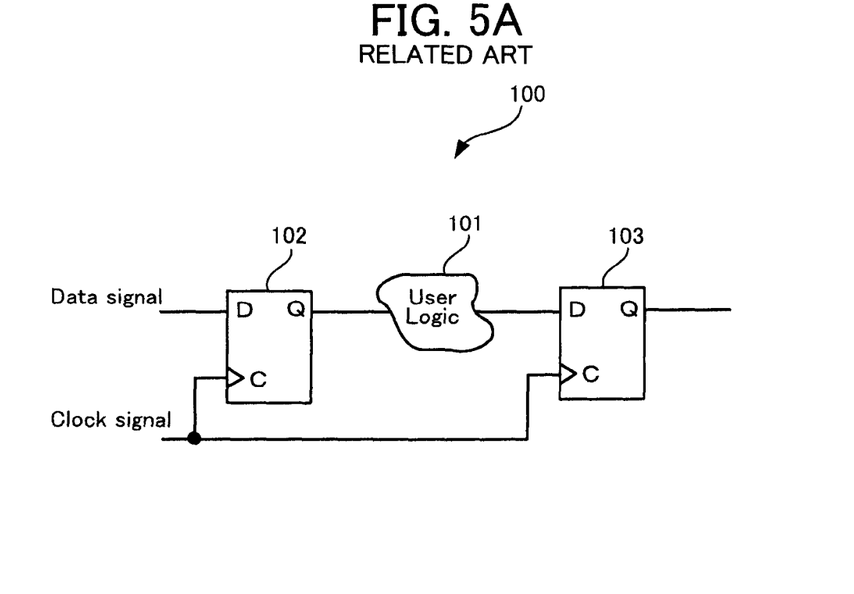
FIGS. 5A and 5B is a schematic drawing showing an exemplary logic circuit and a timing chart showing exemplary operation timings in the logic circuit, respectively.
Figure 5B:
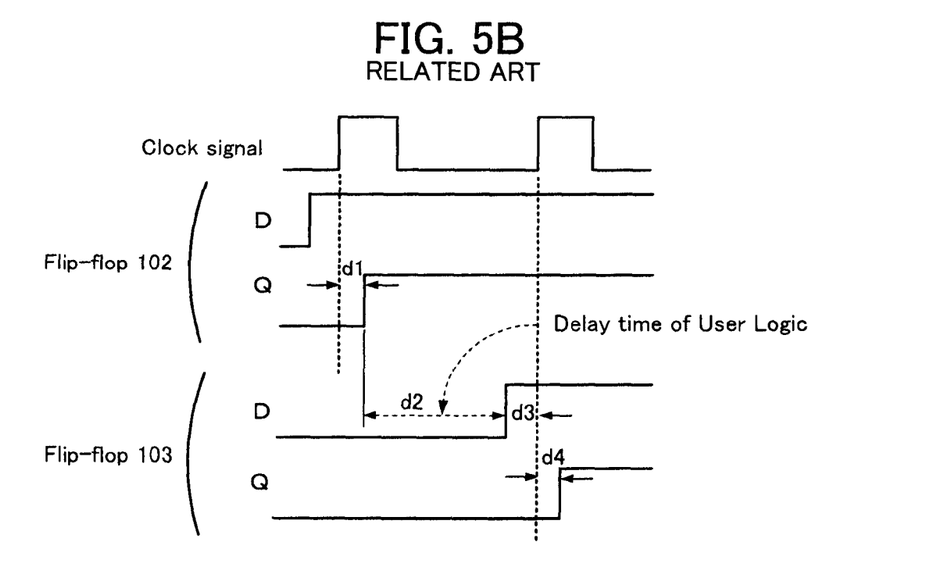

FIGS. 5A and 5B are drawings for explaining the delay test. FIG. 5A shows an exemplary logic circuit 100, and FIG. 5B is a timing chart showing exemplary operation timings in the logic circuit 100.

The exemplary logic circuit 100 shown in FIG. 5A includes a user logic 101, which is a combinational logic circuit, a start-point flip-flop 102 arranged on the input-side of the user logic 101, and an end-point flip-flop 103 arranged on the output-side of the user logic. A clock signal is supplied to clock terminals C of the flip-flops 102 and 103.

As shown in FIG. 5B, 'H' level data signal generated by the user-logic in the preceding stage (not shown) is supplied to D input terminal of the start-point flip-flop 102. The start-point flip-flop 102 captures the 'H' level data signal at the timing of a rising-edge of the clock signal. Further, after a specified delay time d1, the start-point flip-flop 102 outputs the captured data as 'H' level data signal from its output terminal Q. The output 'H' level data signal is input to the user logic 101.

After a specified delay time d2, the user logic 101 outputs a data signal, which is a 'H' level data signal in the example shown in FIG. 5B, based on the 'H' level input data signal. The output 'H' level data signal is supplied to data input terminal D of the end-point flip-flop 103.

If the timing when the 'H' level data signal is input to the D terminal of the end-point flip-flop 103 is faster than the next rising edge of the clock signal by a specified set-up time d3min, the 'H' level data signal is captured in the end-point flip-flop 103 at the timing of the next rising edge of the clock signal. Further, after a specified delay time d4, the acquired data signal is output from the output terminal Q as a 'H' level data signal and supplied to a user logic in the next stage (not shown).

The user logic 101 should be designed to output the output data signal within a delay time less than a cycle time of the clock signal or, more accurately, less than the cycle time of the clock signal by the delay times d1+d3min, which are necessary for operations of the flip-flops 102 and 103. That is, the delay time of a logic signal that passes through the user logic 101 should be designed such that the total delay time of the data path from the start-point flip-flop 101 to the end-point flip-flop 103 (d1+d2+d3min) is less than the cycle time of the clock signal.

When the user logic does not have a fatal defect, such as a defect that a transistor constituting the user logic does not operate, or a defect that a wiring between the transistors is disconnected or short-circuited, the user logic generates an output logic signal having a logical value equal to a value expected from logical values of input logic signals. Even in that situation, however, there are cases that the user logic cannot generate the output logic signal within a specified delay time (or a designed delay time) because, for example, a delay time of a transistor is larger than a designed value and/or a resistance of a wiring between transistors is higher than a designed value.

A delay test is conducted to detect such defects. In the exemplary logic circuit 100 shown in FIG. 5A, a delay test is conducted by i) setting a cycle time of the clock signal to a specified value, and ii) examining whether or not a logic signal is correctly transmitted from the preceding flip-flop (start-point flip-flop) 102 to the succeeding flip-flop (end-point flip-flop) 103.

Specifically, a delay test conducted by operating the logic circuit at "system timing", or timing that a user actually operates the semiconductor integrated circuit (chip), is called "at-speed test". In order to conduct the at-speed test, it is proposed to provide a clock generating circuit that generates a clock signal having edges with an interval of the system timing from a low-frequency clock signal that can be input from a tester. See, for example, "Low cost delay testing of nanometer SoCs using on-chip clocking and test compression," Asian Test Symposium, December 2005, p. 156-161 (non-Patent document 1), which is hereby incorporated by reference in its entirety.

In practice, a user-logic is connected between respective pluralities of start-side flip-flops (start-point flip-flops) and end-side flip-flops (end-point flip-flops). The user-logic generates output signals (output data) based on input signals (input data) supplied from the plurality of start-point flip-flops. The end-point flip-flops capture and hold the generated output data at the timing of an edge of the clock signal.

Paragraphs [0045] to [0048] of US Patent Publication No. 2006-0001434 (Patent document 1), which is hereby incorporated by reference in its entirety, describe a procedure for conducting the delay test. That is, in a shift-mode (or a scan-mode), the flip-flops are connected to form a chain and a clock signal is supplied to set specified data (a test pattern) in the start-point flip-flop. Then, in the capture mode, the user logic is connected between the plurality of start-point flip-flops and plurality of end-point flip-flops and a clock signal is supplied to the flip-flops to capture output data generated by the user logic in the end-point flip-flops. Thereafter, again in the scan mode, a clock signal is supplied to the flip-flops to output the data captured and held in the end-point flip-flops from the semiconductor integrated circuit. The data output from the semiconductor integrated circuit is compared with expected values.

Specially, Patent Document 1 discloses an example of LoS (Launch-off-Shift) method. That is, i) the last clock edge of a clock signal supplied during the shift-mode is utilized as a launching clock edge for supplying the input data, which is set in the start-point flip-flops, to the combinational logic circuit, and ii) after switched to the capture mode, the next clock edge of the clock signal is utilized as a capturing clock-edge for capturing the data output from the combinational logic circuit in the end-side flip-flops. On the other hand, non-patent document 1 discloses an example of LoC (Launch-off-Capture) method. That is, after switched to the capture mode, a clock signal having a launching clock edge and a capturing clock-edge is supplied.

Further, in order to detect a small (short) delay fault that cannot be detected by the at-speed test, "faster-than-at-speed test" is also proposed. See, for example, "Kawasaki Micro maximizes delay test coverage with latest Cadence technology, Encounter True-Time now delivers faster-than-at-speed delay test for bridges and through RAMs" Cadence Design Systems, Inc., San Jose, Calif., Nov. 7, 2005 (non-Patent document 2), which is hereby incorporated by reference in its entirety. That is, a logic circuit is operated at timing faster than the system timing and examined whether or not it generates output data having a logical value equal to an expected value. Also in this case, the clock generating circuit described above may be utilized to generate a clock signal that operates the logic circuit at timing faster than the system timing.

Generally, ATPG (Automatic Test Pattern Generator) is utilized to test semiconductor integrated circuits. The ATPG automatically generates test patterns for conducting various tests on semiconductor integrated circuits. The ATPG is provided with different fault models for detecting different types of faults. Here, a fault model for detecting delay faults due to delays of signal transmissions between flip-flops is provided. The ATPG generates, based on the provide fault model, test patterns that activates signal path having each of the delay faults specified in the model.

Each of the generated test patterns includes a transition of a logical value of input data supplied to a start-side flip-flop, which constitutes a start-point of a signal path having a fault. The transition of logical value included in the test pattern is expected to propagate the signal path, or to cause transitions of logical states at nodes along the signal paths, and is further expected to cause a transition of a logical value of output data supplied to an end-point flip-flop.

Figure 6:
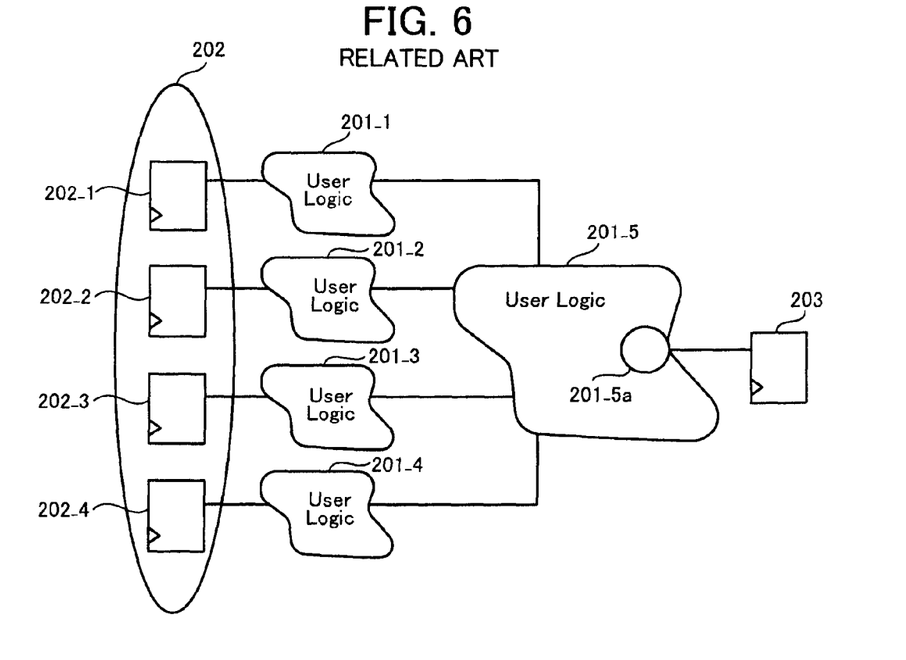
FIG. 6 is a schematic drawing showing a plurality of paths that include an end-point flip-flop 203 as a common end-point.

FIG. 6 is a schematic drawing showing a plurality of paths that include an end-point flip-flop 203 as a common end-point. FIG. 6 shows a plurality of start-points 202 including start-side flip-flops 201_1, 202_2, 202_3, and 202_4, an end-side flip-flop 203, and a plurality of paths between them. The paths start from respective start-point flip-flops to the end-point flip-flop 203 through respective different portions 202_1, 201_2, 202_3, and 202_4 in the user logic and further through the common portion 201_5 of the user logic.

As explained above, a logic circuit provided in a semiconductor integrated circuit includes a plurality of paths having a common end-point flip-flop. One of these paths is activated when testing the semiconductor integrated circuit. For example, when a path having the start-side flip-flop 201_1 as a start-point is activated, a test pattern including a transition of logical value of input data supplied to the start-side flip-flop 201_1, by which a transition of logical value of output data supplied to the end-side flip-flop 203 is expected, is supplied to the plurality of start-points 202. By using such a test pattern, a delay fault that exists at an arbitrary position on the path from the start-point flip-flop 202_1 to the end-point flip-flop 203 through the portions 201_1 and 201_5 of the user logic may be detected.

Similarly, when a path having the start-side flip-flop 202_2 as a start-point is activated, a delay fault exists at an arbitrary position on the path from the start-point flip-flop 202_2 to the end-point flip-flop 203 through the portions 201_2 and 201_5 of the user logic may be detected. The situation is the same when a path having the start-side flip-flop 202_3 or 202_4 as a start-point is activated.

Delay faults in a logic circuit have various sizes. Here, "size of a delay fault" means an increase of delay time, from the designed value, of a path due to an existence of the delay fault on the path. When a test is conducted with a certain test timing, delay faults having a size larger than a difference between the test timing and the delay time (a designed value, i.e., a value when no delay fault exists) of the path activated by ATPG can be detected. Here, different paths have different delay times. Accordingly, a detectable size of delay fault depends on which of the paths is activated even when the test is conducted with the same test timing.

Now, "minimum slack margin" and "minimum detectable size of delay fault," which are important factors in detecting delay faults, will be explained.

In general, when a delay fault that exists at a certain position in a logic circuit can be detected by activating any one of a group of signal paths, a difference between a delay time (a designed value with no delay fault) of the longest one of the group of paths and the system timing is called "minimum slack margin".

For example, it may be assumed that i) a group of signal paths includes a common end-point and that ii) a delay fault exists at a portion commonly included in the group of signal paths, as shown in FIG. 6. In this case, the delay fault may be detected by activating any one of the group of paths. FIG. 6 shows a delay fault 201_5a positioned at the portion 201_5 of the user logic, which is commonly included in all of the paths, as a representative of delay faults that may be detected by activating any one of the four paths.

Accordingly, "minimum slack margin" is a difference between the delay time of the longest path among the four paths shown in FIG. 6 and the system timing. Note that, even if a delay fault exists, the delay fault does not cause a malfunction of the logic circuit at the system timing, if the size of the delay fault is smaller than the minimum slack margin.

In FIG. 6, a delay fault 201_5a is shown as a representative of delay faults that may be detected by activating any one of the four paths. Even if the delay fault 201_5a exists at any positions, other than the position shown in FIG. 6, along the four signal paths, the delay fault does not cause a malfunction of the portion of user logic shown in FIG. 6 at the system timing, if the size of the delay fault is smaller than the minimum slack margin.

On the other hand, a difference between a delay time of a path and the system timing is a size of delay fault that is detectable when ATPG activates that path. And the difference between a delay time of the longest one of the activated paths and the system timing is "minimum detectable size of delay fault".

Figure 7:
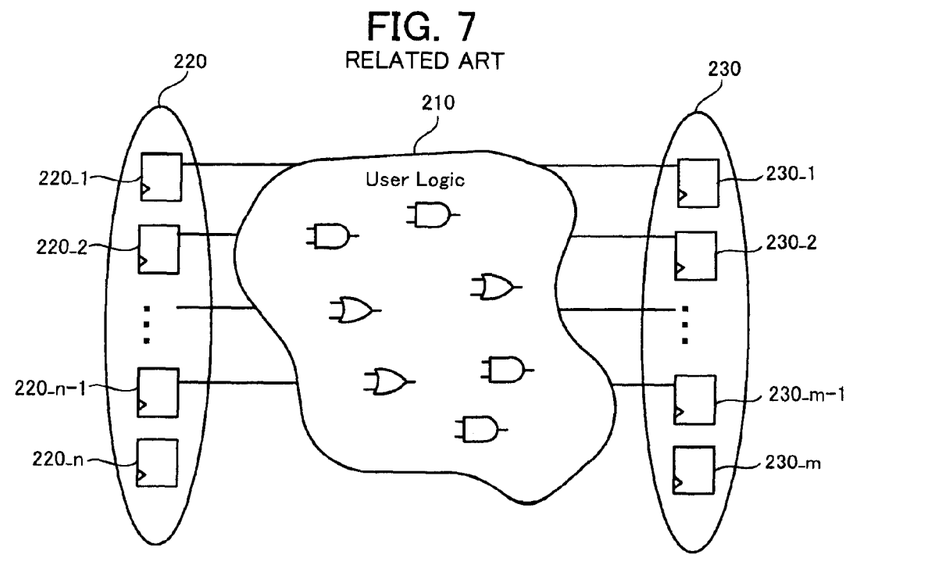
FIG. 7 is a schematic drawing showing an exemplary construction of a circuitry included in a chip of a semiconductor integrated circuit.

FIG. 7 is a schematic drawing showing an exemplary construction of a circuitry included in a chip of a semiconductor integrated circuit.

FIG. 7 shows a user logic (a combinational logic) 210, a plurality of start-points 220, and a plurality of end-points 230, which constitute an exemplary logic circuit included in an exemplary semiconductor integrated circuit. The plurality of start-points 220 includes start-side flip-flops 220_1, 220_2, ... 220_n−1, and 220_n. The plurality of end-points 230 includes end-side flip-flops 230_1, 230_2, ... 230_m−1, and 230_m. The user logic 210 includes a plurality of signal paths having respective different delay times.

That is, a logic circuit of a semiconductor integrated circuit includes a plurality of signal paths having respective different delay times. Accordingly, the plurality of end-point flip-flops has respective different minimum slack margins and minimum detectable sizes of delay faults.

Figure 8:
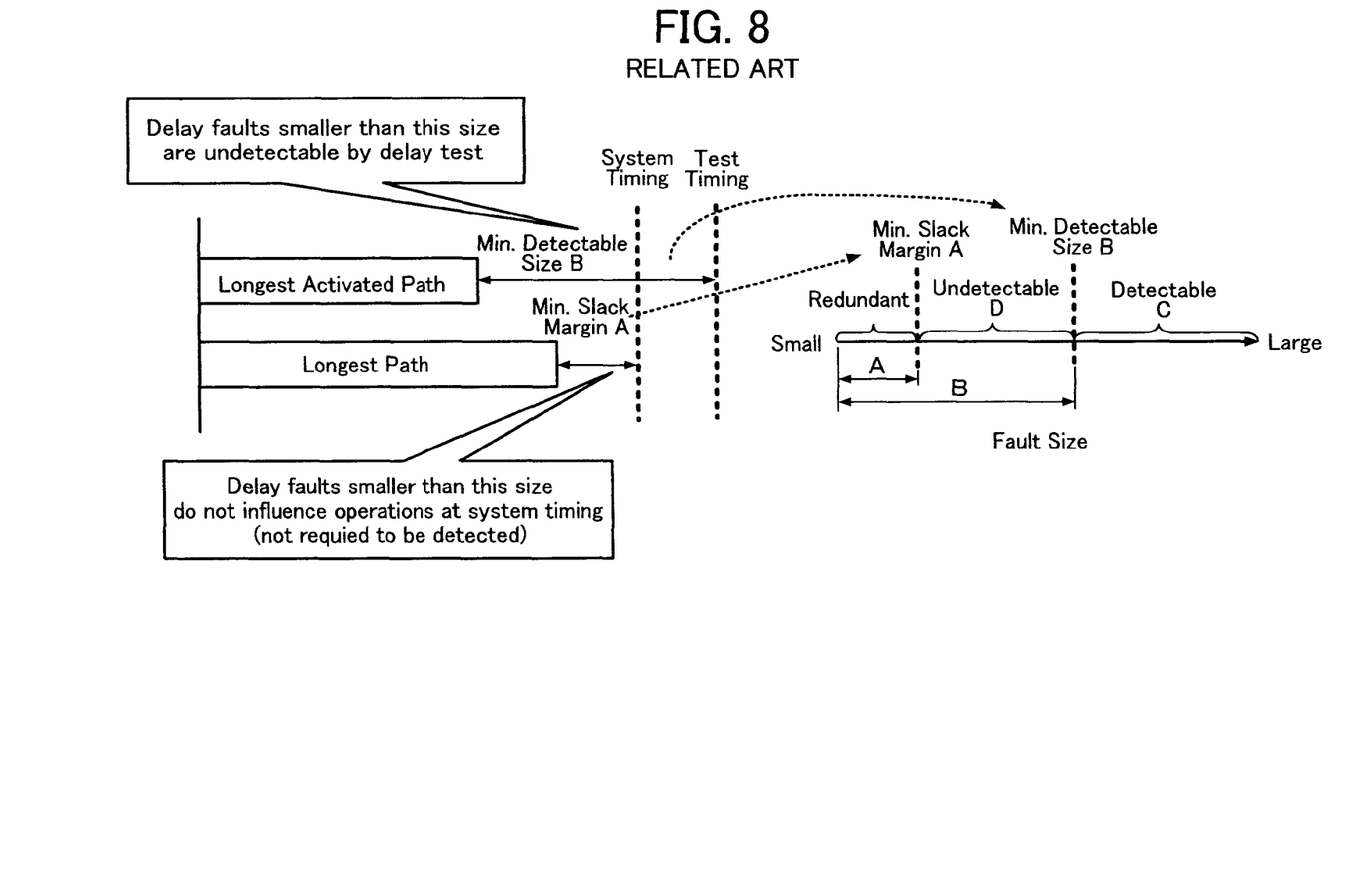
FIG. 8 is a schematic drawing showing an exemplary relationship between the minimum slack margin and the minimum detectable size of delay fault.

FIG. 8 is a schematic drawing showing an exemplary relationship between the minimum slack margin and the minimum detectable size of delay fault.

FIG. 8 shows system timing and test timing, which is slower than the system timing. As explained above, even if a delay fault exists, it does not cause any influence on an actual operation of a logic circuit at the system timing, if the size of delay fault is smaller than "minimum slack margin A", or a difference between "system timing" and "longest path". For example, in the case shown in FIG. 6, "longest path" is the delay time of the longest one of the paths having the common endpoint 203. Accordingly, it is not necessary to detect such small delay faults, as indicated as "redundant" in FIG. 8.

On the other hand, delay faults having sizes larger than "minimum detectable size of delay fault B", which is the difference between "longest activated path" and "test timing", may be detected ("detectable range C") by the delay test. For example, in the case shown in FIG. 6, "longest activated path" is the delay time of the longest one of activated paths among the paths having the common endpoint 203.

However, delay faults having sizes larger than "minimum slack margin A" and smaller than "minimum detectable size of delay default B" cannot be detected ("undetectable range D" shown in FIG. 8) even though such delay faults cause influences on the actual operation at the system timing. Accordingly, the test quality is insufficient.

As explained above, "faster-than-at-speed test" is proposed to detect such small delay faults. Previously, however, the test industry was not eager to detect small delay faults by utilizing the faster-than-at-speed test because of a risk of "overkill" or an excessive detection of small delay faults.

SUMMARY

In order to address the problems described above, an exemplary object of this invention is to provide methods of generating test conditions and apparatuses for generating the same that efficiently detect delay faults while preventing overkills. Another exemplary object of this invention is to provide apparatuses for evaluating test conditions to determine whether or not overkills occur.

Exemplary embodiments according to this disclosure provide methods of generating test conditions for detecting delay faults in a semiconductor integrated circuit that operates at a system timing. The methods include generating a test pattern to be used in a test of a logic circuit in the semiconductor integrated circuit, determining a minimum slack margin, setting a test timing faster than the system timing, simulating an operation of the logic circuit at the test timing, and storing the test pattern and the test timing in a test condition database. The logic circuit includes a plurality of signal paths having respective delay times through a combinational logic circuit between respective pluralities of start-side flip-flops and end-side flip-flops. The test pattern including a transition of a logical value of input data to be supplied to a first one of the start-side flip-flops that produces an expected transition of a logical value of output data supplied to a first one of the end-side flip-flops. The minimum slack margin is determined as a difference between the system timing and one of i) a longest one of the delay times of a first group of the signal paths from respective ones of the start-side flip-flops to the first one of the end-side flip-flops and ii) a longest one of the delay times of a second group of the signal paths from the first one of the start-side flip-flops to respective ones of the end-side flip-flops. The simulating uses the test pattern and the delay times of the signal paths corrected by adding the minimum slack margin. The storing includes, when the simulating indicates that the output data after the expected transition is not acquired in the first one of the end-side flip-flops at the test timing, further storing mask data that masks data held in the first one of the end-side flip-flops in the test using the test pattern and the test timing in the test condition database.

According to various exemplary embodiments, the delay times of the signal paths used in the simulating may be corrected by adding the minimum slack margin to a delay time of a portion commonly included in all of one of the first and the second groups of signal paths. Further, the portion commonly included in all of the first group of signal paths may be a data input terminal of the first one of the end-side flip-flops and the portion commonly included in all of the second group of signal paths may be an output terminal of the first one of the start-side flip-flops.

According to various exemplary embodiments, the methods may further include, after storing the test pattern and the mask data in the test condition database, evaluating a ratio of the delay faults in the logic circuit detectable using the test pattern, the test timing, and the mask data stored in the test condition database. When the ratio is less than a target value, the methods may further include setting a relaxed test timing faster than the system timing and slower than the test timing, simulating a third operation of the logic circuit at the relaxed test timing, and storing the third test pattern and the relaxed test timing in the test condition database. The simulating may use a third test pattern, which includes a transition of a logical value of third input data to be supplied to a third one of the start-side flip-flops that produces a third expected transition of a logical value of third output data supplied to a third one of the end-side flip-flops, and the delay times of the signal paths corrected by adding a third minimum slack margin, which is determined as a difference between the system timing and one of i) a longest one of the delay times of a fifth group of the signal paths from respective ones of the start-side flip-flops to the third one of the end-side flip-flops and ii) a longest one of the delay times of a sixth group of the signal paths from the third one of the start-side flip-flops to respective ones of the end-side flip-flops. The storing may includes, when the simulating indicates that the third output data after the third expected transition is not acquired in the third one of the end-side flip-flops at the relaxed test timing, further storing second mask data that masks data held in the third one of the end-side flip-flops in the test using the third test pattern and the relaxed test timing in the test condition database.

According to various exemplary embodiments, the third test pattern may be the same as the test pattern, or the third test pattern may activate a signal path having a delay fault other than those detectable by the test pattern, the test timing, and the mask data stored in the test condition database.

Exemplary embodiments according to this disclosure provide apparatuses for generating test conditions for detecting delay faults in a semiconductor integrated circuit that operates at a system timing. The apparatuses include a test pattern generating block that generates a test pattern to be used in a test of a logic circuit in the semiconductor integrated circuit, a minimum slack margin determining block that determines a minimum slack margin, a test timing correcting block that sets a test timing faster than the system timing, a simulation block that performs a simulation of an operation of the logic circuit at the test timing, and a data storing block that stores the test pattern and the test timing in a test condition database. The logic circuit includes a plurality of signal paths having respective delay times through a combinational logic circuit between respective pluralities of start-side flip-flops and end-side flip-flops. The test pattern includes a transition of a logical value of input data to be supplied to a first one of the start-side flip-flops that produces an expected transition of a logical value of output data supplied to a first one of the end-side flip-flops. The simulation block performs the simulation using the test pattern and the delay times of the signal paths corrected by adding the minimum slack margin. The data storing block further stores, when the simulation indicates that the output data after the expected transition is not acquired in the first one of the end-side flip-flops at the test timing, a mask data that masks data held in the first one of the end-side flip-flops in the test using the test pattern and the test timing in the test condition database.

Exemplary embodiments according to this disclosure provide apparatuses for evaluating a test condition for a faster-than-at-speed test of a semiconductor integrated circuit that operates at a system timing. The apparatuses include a test pattern generating block that generates a test pattern to be used in a test of a logic circuit in the semiconductor integrated circuit, a minimum slack margin determining block that determines a minimum slack margin, a test timing correcting block that sets a test timing faster than the system timing, and a simulation block that performs a simulation of an operation of the logic circuit at the test timing. The logic circuit includes a plurality of signal paths having respective delay times through a combinational logic circuit between respective pluralities of start-side flip-flops and end-side flip-flops. The test pattern includes a transition of a logical value of input data to be supplied to a first one of the start-side flip-flops that produces an expected transition of a logical value of output data supplied to a first one of the end-side flip-flops. The simulation block determines that an overkill occurs in the test using the test pattern and the test timing when the simulation indicates that the output data after the expected transition is not acquired in the first one of the end-side flip-flops at the test timing.

BRIEF DESCRIPTION OF THE DRAWINGS

Various exemplary details of methods of generating test conditions, apparatuses for generating test conditions, and apparatuses for evaluating test conditions are described with reference to the following figures, wherein.

DETAILED DESCRIPTION OF EMBODIMENTS

Exemplary embodiments of this disclosure will be explained with reference to attached drawings.

Firstly, faster-than-at-speed test and overkill in the faster-than-at speed test will be explained with reference to FIGS. 9 and 10.

Figure 9:
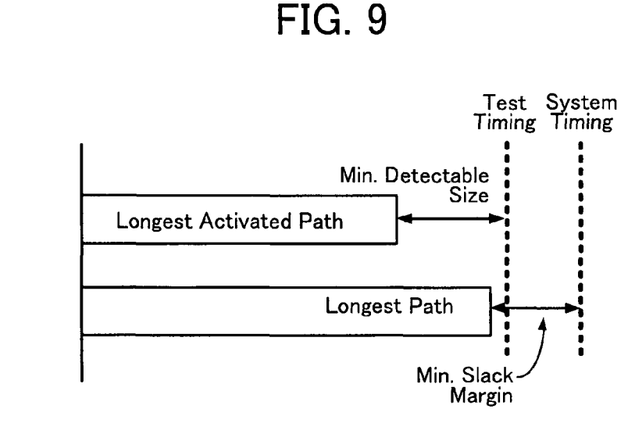
FIG. 9 is a schematic drawing explaining faster-than-at-speed test.

FIG. 9 is a schematic drawing explaining the faster-than-at-speed test. In the faster-than-at-speed test, a delay test is conducted with test timing faster than the system timing. As a result, the minimum detectable size of delay fault B is decreased and small delay faults that cannot be detected by the at-speed test can be detected.

However, test timing faster than the system timing may make the minimum detectable size of delay fault smaller than the minimum slack margin in some of the paths. That is, delay faults having sizes smaller than the minimum slack margin may be excessively detected even though such small delay faults do not cause influence on actual operations. This situation is called "overkill" that results in a decreased yield.

Figure 10:
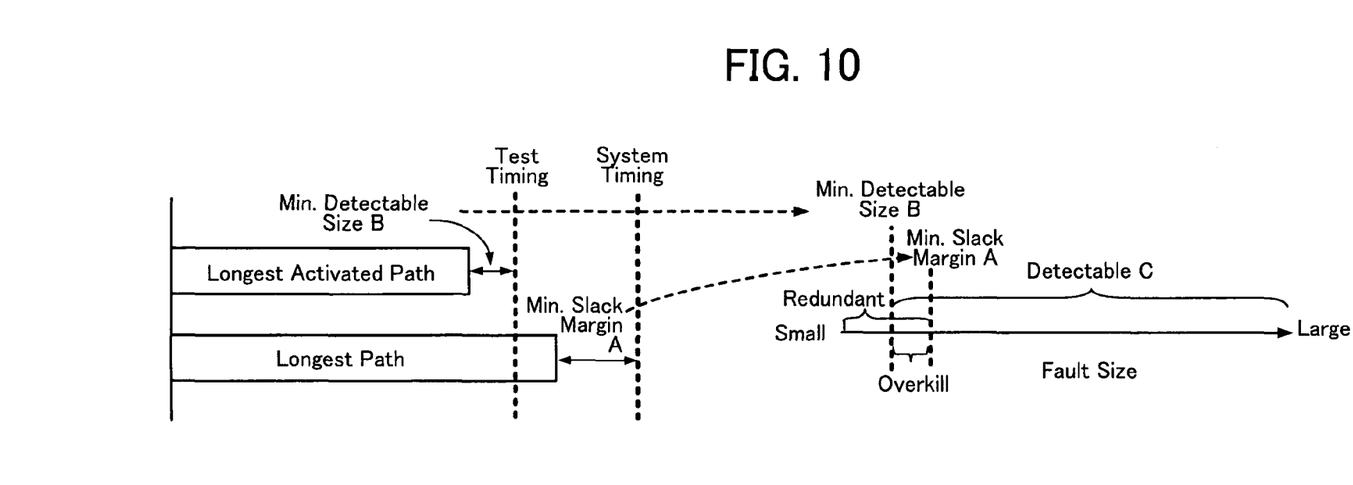
FIG. 10 is a schematic drawing explaining a concept of overkill.

FIG. 10 is a schematic drawing explaining the concept of overkill. In the exemplary test shown in FIG. 10, test timing faster than the system timing causes detection of delay faults having sizes smaller than the "minimum slack margin A". As a result, excessive detection or (overkill) occurs.

A logic circuit of a semiconductor integrated circuit includes, as explained with reference to FIG. 7, a plurality of signal paths from a plurality of start-point flip-flops to a plurality of end-point flip-flops. Considering one of the end-point flip-flops, as shown in FIG. 6, there exist a plurality of signal paths from respective pluralities of start-point flip-flops to the end-point flip-flop. These signal paths have respective different delay times.

Further, in actual testing, it is difficult to test all signal paths. Only some of the paths that ATPG selects as target paths are tested. In order to efficiently detect delay faults, it is necessary to appropriately set the test timing depending on a delay time (a designed value) of each of the paths to be tested. If the test timing is too slow, small delay faults cannot be detected. If the test timing is too fast, on the other hand, delay faults having sizes that do not influence actual operations of logic circuits are excessively detected. As a result, overkill occurs and some semiconductor integrated circuits that may be shipped as good products are determined as bad ones. This phenomenon makes an efficient detection of delay faults in semiconductor integrated circuits difficult.

Now, exemplary test condition generation apparatuses and exemplary methods of generating test conditions will be explained.

Figure 1:
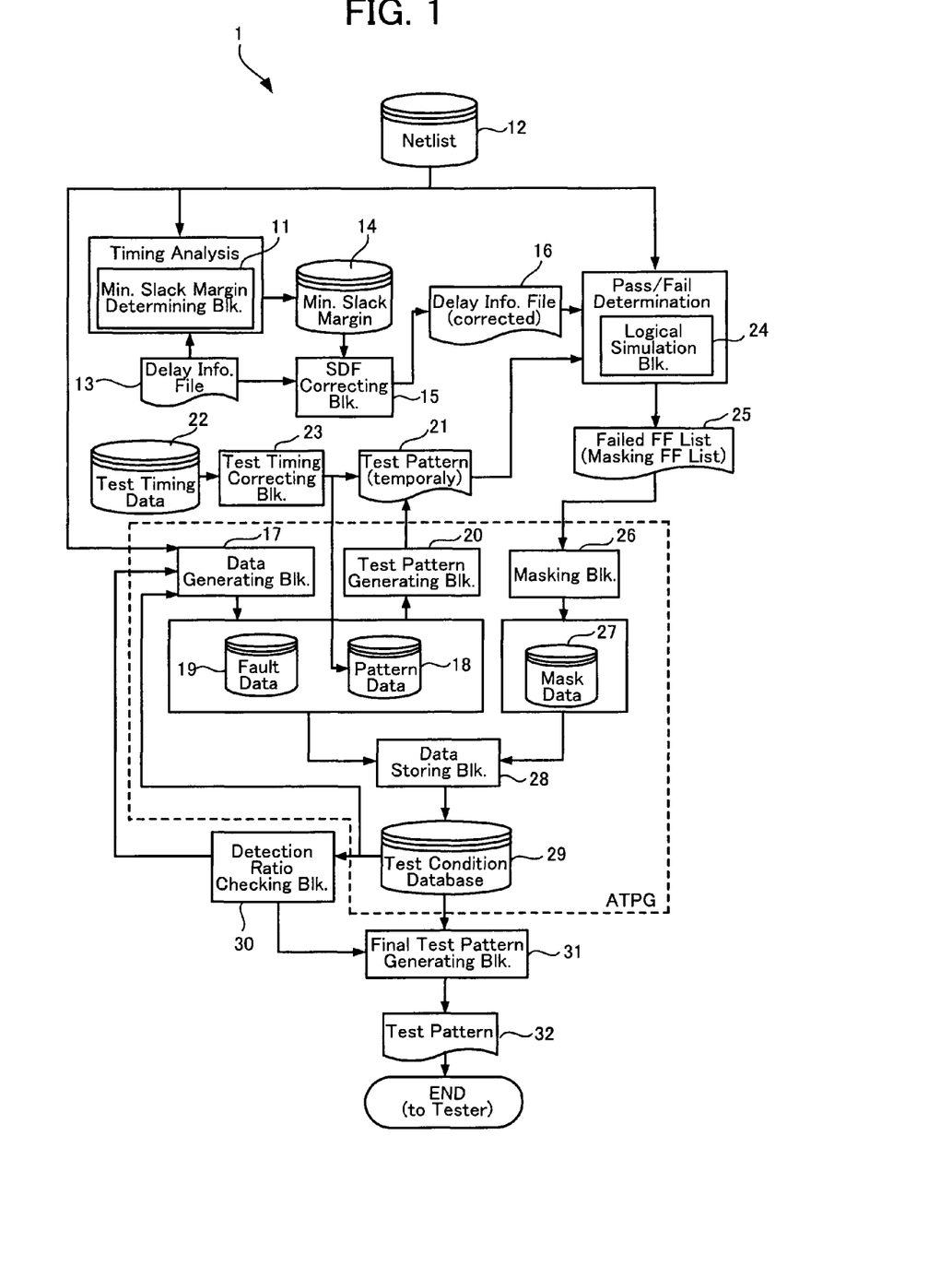
FIG. 1 is a schematic drawing showing a construction of an exemplary test condition generating apparatus.

FIG. 1 is a schematic drawing showing a construction of an exemplary test condition generating apparatus. The exemplary test condition generating apparatus 1 shown in FIG. 1 practices exemplary methods of generating test conditions.

The exemplary test condition generating apparatus 1 shown in FIG. 1 generates test conditions for detecting delay faults in semiconductor integrated circuits and stores generated test conditions in a test condition database. A semiconductor integrated circuit to be tested includes a logic circuit in which a plurality of signal paths is formed between a plurality of start-side flip-flops and a plurality of end-side flip-flops through a combinational logic circuit.

The exemplary test condition generating apparatus 1 shown in FIG. 1 includes minimum slack margin determining block 11 that determines minimum slack margins required for logical simulation of the logic circuit. The exemplary test condition generating apparatus 1 also includes netlist storage block 12 that stores netlist, which is connection information of the logic circuit. The exemplary test condition generating apparatus 1 further includes delay information file 13, which includes information of various delay times. Specifically, it may include delay times (delay times between their pins and various timing restraints) of cells (flip-flops on the start- and end-sides, and various logical gates that constitute user logics) exist on the netlist, delay times of wirings between the cells, and so on. The delay information file is generated by referring to a library that stores delay times of various types of cells and wirings (not shown in FIG. 1) and the netlist. The delay information file 13 may include the information in SDF (Standard Delay Format).

The minimum slack margin determining block 11 performs timing analysis of the logic circuit and determines minimum slack margins by referring to the netlist stored in netlist storage block 12 and delay information file 13. The determined minimum slack margins are stored in minimum slack margin storage block 14. The minimum slack margin determining block 11 may performs the timing analysis by static timing analysis (STA).

Specifically, a minimum slack margin is determines as one of i) a difference between delay time of the longest one of a plurality of signal paths having an end-side flip-flop as a common end-point and the timing of actual operation of the logic circuit to be tested, and ii) a difference between delay time of the longest one of a plurality of signal paths having a start-side flip-flop as a common start-point and the timing of the actual operation. Here, minimum slack margin is determined for each of end-side flip-flops that are shared as common end-points or for each of start-side flip-flops that are shared as common start-points including those not required for the logical simulation of the logic circuit.

The exemplary test condition generating apparatus 1 further includes SDF correction block 15. The SDF correction block 15 corrects the delay information stored in the delay information file 13 by referring to minimum slack margins stored in the minimum slack margin storage block 14, and generates corrected delay information file. When a minimum slack margin is determined by considering signal paths having a common end-point flip-flop, for example, the minimum slack margin may be added to delay time of input terminal of the common end-point flip-flop.

The exemplary test condition generating apparatus 1 further includes data generating block 17. The data generating block 17 generates a fault model that describes positions of faults to be detected in the logic circuit by referring to the netlist stored in the netlist storage block 12, and stores generated fault model in fault data storage block 19.

The data generating block 17 also generates pattern data including input data and expected values for detecting delay faults by referring to the netlist and the fault model. Generated pattern data is stored in pattern data storage block 18. The input data, which is a combination of dada before and after a transition, is supplied to start-side flip-flops of the logic circuit to be tested. The expected values are logical values of data expected to be acquired in end-point flip-flops after transitions caused by the transition of input data. The pattern data also includes data specifying the test timing.

The data generating block 17 further generates a fault status data that describes which of the delay faults in the fault model are detectable using the generated pattern data. The fault status data is also stored in the fault data storage block 19.

The exemplary test condition generating apparatus 1 further includes test pattern generating block 20. The test pattern generating block 20 generates test pattern (temporary) by transforming the format of the data stored in the pattern data storage block 18 into a format usable by logical simulation block 24. The exemplary test condition generating apparatus 1 also includes test timing data storage block 22. The test timing data storage block 22 stores test timings including the fastest test timing for conducting the faster-than-at-speed test and successively relaxed test timings.

The exemplary test condition generating apparatus 1 further includes test timing correcting block 23. The test timing correcting block 23 sets test timings faster than the actual operation timing of the logic circuit. Specifically, the test timing correcting block 23 corrects a default value of the test timing included in the pattern data by using the fastest test timing stored in the test timing data storage block 22. Simultaneously, the data for test timing included in the pattern data stored in the pattern data storage block 18 is also corrected.

The exemplary test condition generating apparatus 1 further includes logical simulation block 24. The logical simulation block 24 performs simulations of i) transitions of logical values of output data supplied to end-side flip-flops caused by transitions of logical values of input data supplied to start-side flip-flops, and ii) acquisitions of the output data after the transition in the end-side flip-flops.

The logical simulation block 24 performs logical simulation by using delay times between start-side flip-flops and end-side flip-flops corrected by adding the minim slack margin. Specifically, the logical simulation block 24 performs the logical simulation by referring to the netlist stored in the netlist storage block 12, the delay information file (corrected) 16, and the test pattern (temporally) 21. Further, the logical simulation block 24 generates failed FF list (or masking FF list) 25 by referring to the result (pass/fail) of the simulation.

The exemplary test condition generating apparatus 1 further includes masking block 26, mask data storage block 27, data storing block 28, and test condition database 29. The masking block 26 generates mask data. That is, when the logical simulation indicates that an end-side flip-flop cannot acquire output data after an expected transition of logical value caused by inputting a test pattern at the test timing, the masking block 26 generates mask data. The mask data makes the data held in the end-side flip-flop out of a determination in the test using the test pattern and the test timing. The data storing block 28 stores the mask data in the test condition database 29.

Specifically, the masking block 26 receives masking FF list 25 generated by the logical simulation block 24 and generate the mask data. The masking block 26 further stores the generated mask data in the mask data storage block 27. When mask data generated by referring to results of logical simulations performed using test patterns, which are generated using certain pattern data and corrected using certain test timing, is stored in the mask data storage block 27, the data storing block 28 stores the fault data, the pattern data, and the mask data in the test condition database 29.

The test condition generating apparatus 1 further includes fault detection ratio checking block 30. The fault detection ratio checking block 30 evaluates a ratio of detecting delay faults in the logic circuit to be tested by referring to the data stored in the test condition database 29. When the evaluated detection ratio does not reach a target value, the fault detection ratio checking block 30 instructs the data generating block 17 to re-generate data. At this step, by referring to test conditions stored in the test condition database 29, the data generating block 17 re-generates fault data and pattern data so that delay faults that cannot be detected by previously generated test conditions may be detected.

Specifically, data is generated using a portion of the fault model that describes delay faults at positions different from the delay faults that can be detected by the test conditions previously stored in the test condition database 29. Generated pattern data and fault status data are stored in the pattern data storage block 18 and in the fault data storage block 19, respectively. Then, logical simulation is repeated using the test pattern generated by the stored pattern data and the test timing corrected, or relaxed, by the test timing correcting block 23.

In addition to the fastest test timing, the test timing data storage block 22 stores a plurality of test timings that successively relax the fastest test timing. When the fault detection ratio checking block 30 instructs re-generation of data, test timing is corrected using one of the successively relaxed test timings. As a result, logical simulation is repeated at slower test timing than the timing of the first simulation, within the range of the faster-than-at-speed test. In the second and later repetitions, logical simulations are preformed at further slower test timings. It is also possible for the fault detection ratio checking block 30 to instruct the test timing correcting block 23 to relax the test timing without re-generating the data.

After the repeated simulation, mask data for the relaxed test timing is generated and stored in the mask data storage block 27. At this step, the fault data, the pattern data, and the mask data are stored, or accumulated, in the test condition database 29. The fault detection ration checking block 30 issues an instruction to final test pattern generating block 31 when the detection ratio reaches the target value. The final test pattern generating block 31 generates, based on the test conditions stored (accumulated) in the test condition database 29, test patterns 32 actually used by a tester (testing apparatus).

In FIG. 1, portions enclosed by the broken line, which includes the data generating block 17, pattern data storage block 18, fault data storage block 19, test pattern generating block 20, masking block 26, mask data storage block 27, data storing block 28, and test condition database 29, corresponds to the ATPG.

The exemplary test pattern generating apparatus 1 may be constructed in a computer system. Specifically, each of various blocks including the minimum slack margin determining block 11, SDF correcting block 15, data generating block 17, test pattern generating block 20, test timing correcting block 23, logical simulation block 24, masking block 26, data storing block 28, detection ratio checking block 30, final test pattern generating block 31 may be constructed in a computer system using software. Each of various storage blocks including the netlist storage block 12, minimum slack margin storage block 14, Pattern data storage block 18, fault data storage block 19, test timing data storage block 22, mask data storage block 27, and test condition database 29 may be constructed in a storage device of a computer system.

Figure 2:
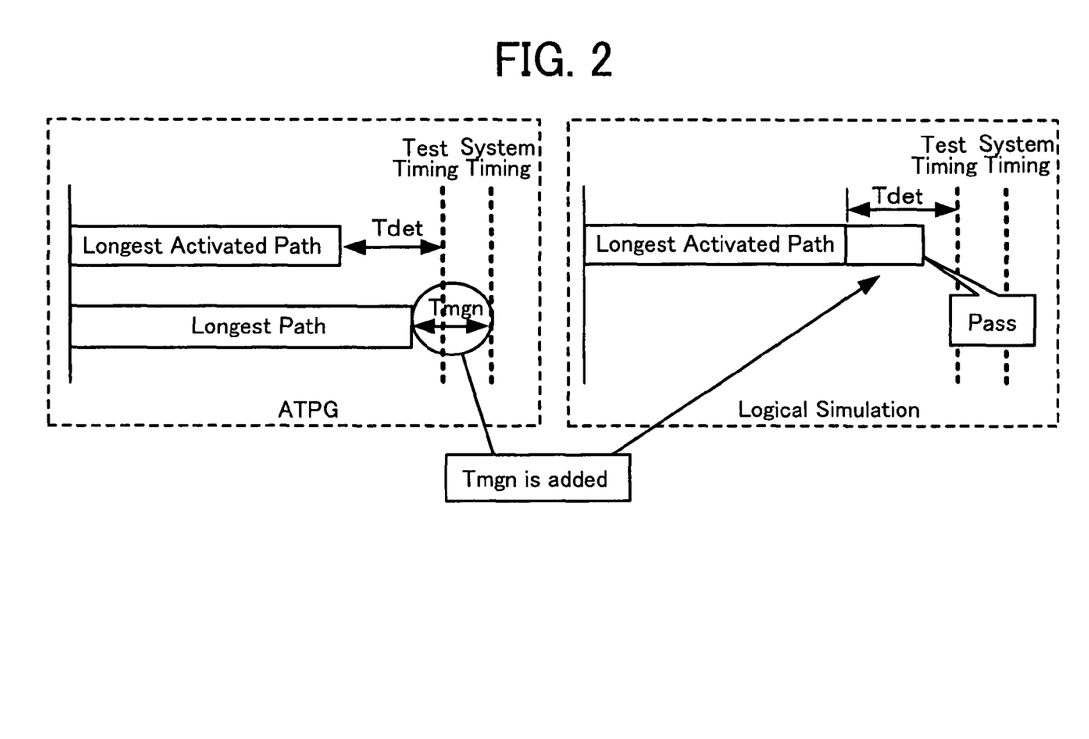
FIG. 2 is a schematic drawing showing relationships between longest pass and longest activated paths and system and test timings (left) and a relationship between delay time of the longest activated path to which a minimum slack margin is added and the test timing (right), respectively, in a case that a difference between the delay time of the longest activated path and the test timing exceeds the minimum slack margin.
Figure 3:
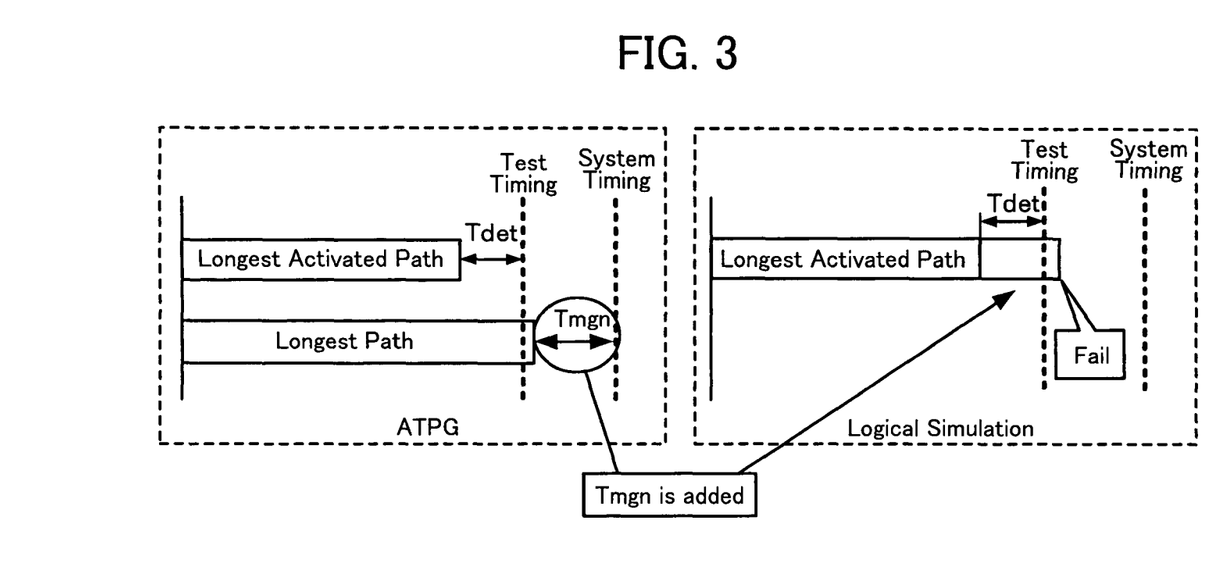
FIG. 3 is a schematic drawing showing relationships between longest pass and longest activated paths and system and test timings (left) and a relationship between delay time of the longest activated path to which a minimum slack margin is added and test timing (right), respectively, in a case that a difference between the delay time of the longest activated path and the test timing is less than the minimum slack margin.

FIGS. 2 and 3 are schematic drawings showing situations that a simulation performed in the test condition generating apparatus shown in FIG. 1 indicates that overkill does not and does occur, respectively.

The logical simulation block 24 performs a logical simulation to determine whether or not a certain test timing of the faster-than-at speed test causes overkill in a path activated by ATPG shown in FIG. 1. In the logical simulation, the logical simulation block 24 uses delay times stored in the delay information file corrected by adding the minimum slack margin (Tmgn). Specifically, a minimum slack margin is determined by the timing analysis for each of end-point flip-flops, and is added to delay time of input terminal of the same end-point flip-flop. Note that, different end-point flip-flops have different minimum slack margins.

The left side of FIG. 2 shows i) the longest path (lower) among a group of signal paths having a certain end-side flip-flop as a common end-point, and ii) the longest activated path (upper), which in the longest one among the paths activated by ATPG in the group, and their relationships with the system and test timings. The right side of FIG. 2 shows a relationship between the delay time of the longest activated path to which the minimum slack margin is added, and the test timing.

Specifically, FIG. 2 shows an example that a difference between the delay time of the longest activated path and the test timing, which is the minimum detectable size of delay fault (Tdet), exceeds the minimum slack margin (Tmgn). In this case, a sum of the delay time of the longest activated path and the minimum slack margin is shorter than the test timing. Accordingly, in the logical simulation, the end-point flip-flop can acquire output data after an expected transition of logical value, and the simulation results in "pass". When the logical simulation performed using delay times corrected by adding the minimum slack margin passes, such as the case explained above, no overkill occurs at the simulated test timing.

On the other hand, FIG. 3 shows an example that a difference Tdet (minimum detectable size of delay fault) between the delay time of the longest activated path and the test timing is less than the minimum slack margin (Tmgn). In this case, a sum of the delay time of the longest activated path and the minimum slack margin is longer than the test timing. As a result, the end-point flip-flop cannot capture output data after an expected transition of logical value, and the logical simulation results in "fail". When the logical simulation performed using delay times corrected by adding the minimum slack margin fails, as explained above, overkill occurs at the simulated test timing.

The logical simulation block 24 in the exemplary test condition generating apparatus shown in FIG. 1 performs logical simulations of paths activated by ATPG each having an end-point flip-flop. Based on the results of logical simulations, the logical simulation block generates a list of failed end-point flip-flops, or a failed FF list. When the paths activated by ATPG include a plurality of paths having the same end-side flip-flop as a common end-point, the end-side flip-flop is added to the failed FF list if the simulation results in "fail" for any one of the paths having the same end-side flip-flop. In other words, if the longest one of a plurality of activated paths having an end-side flip-flop as a common end-point fails, the end-side flip-flop is added to the failed FF list.

As explained above, minimum slack margins are different for respective end-point flip-flops. Accordingly, respective signal paths having different end-side flip-flops as their end-points are simulated using different minimum slack margins, and judged to be masked or not.

The masking block 26 instructs ATPG to read the failed FF list generated by the logical simulation block 24 as mask data (ignore_FF_List). When the data storing block 28 stores the test condition in the test condition database 29, it replaces expected values for end-point flip-flops stored in the mask data storage block 27 (which fail and cause overkills) with X (don't care). Thereby, the failed end-point flip-flops are masked.

The masking caused decrease of detection ratio of delay faults because the test condition generated by ATPG does not detect delay faults exist along signal paths having masked flip-flops as end-points. Accordingly, after logical simulation and masking are performed once, test timing is relaxed and logical simulation is performed again with the relaxed test timing. That is, a signal path in the situation shown on the right-side of FIG. 3 is changed to the situation shown on the right-side of FIG. 2 and makes a delay fault on the signal path unmasked and detectable. As a result, detection ratio may be increased without causing overkills.

The test timing is relaxed repeatedly until the detection ratio reaches the target value, or the test timing reaches to the system timing and the test becomes the at-speed test. The relaxing of test timing should be made successively, because overkill occurs in each of the paths activated by ATPG at different test timing.

When the detection ratio evaluated by the detection ratio checking block 30 is less than the target value, it is not always necessary to instruct the test data generating block 17 to re-generate test data. That is, it is possible to repeat simulations and mask data generations with successively relaxed test timings using the same test data. In this case, the fastest test timing or the test timing that can detect the smallest delay fault, within the limit that does not cause overkill, may be set for each of the test patterns.

On the other hand, re-generating of data in the data generation block 17 under the instruction of the detection ratio checking block 30 may improve the detection ratio. Specifically, re-generating of data may be performed to generate pattern data that detect delay faults described in the fault model other than those detectable by the test conditions previously stored in the test condition database 29. As a result, it is expected that test patterns that is able to detect delay faults other than those detectable by the previously generated test patterns can be generated.

As explained above, various exemplary embodiments according to this disclosure provide method and apparatuses for generating test conditions that can efficiently detect delay faults while preventing overkills. Accordingly, various exemplary embodiments of this disclosure enable to utilize the faster-than-at-speed test without the risk of overkill.

That is, according to various exemplary embodiments for generating test conditions to detect delay faults in semiconductor integrated circuit, occurrence of overkill in the faster-than-at-speed test is prevented. As a result, the test quality may be improved by utilizing the ability of the faster-than-at-speed test to detect small delay faults without decreasing the yield due to the overkill.

The exemplary test condition generating apparatus 1 may also be utilized as an apparatus to evaluate a test condition and to determine whether or not a certain test condition causes overkill at a certain test timing. That is, when a simulation performed by using delay times of signal paths corrected by adding a minim slack margin indicates that output data after an expected transition cannot be acquired in an end-point flip-flop of a path activated by a test pattern at a test timing, it may be determined that overkill occurs in a test using the test pattern and the test timing. The determination enables to conduct some countermeasures to prevent the overkill. The countermeasure may include masking the failed flip-flop, modifying the test pattern, and so on.

In the above explanation, as shown in FIG. 6, the minimum slack margin is determined for a plurality of signal paths having an end-side flip-flop 203 as a common end-point. That is, the minimum slack margin is calculated as a difference between i) delay time of the longest one of the plurality of signal paths having the end-side flip-flop 203 as the common end-point and ii) the system timing. The logical simulation is performed using delay times of the signal paths corrected by adding the minimum slack margin, and the test condition is generated by masking the end-side flip-flop 203 when it is determined that overkill occurs at the longest one of the paths activated by the ATPG.

In this case, when performing the logical simulation, it is preferable to add the minimum slack margin to a delay time of a portion commonly included in all of the plurality of signal paths having the common end-point. Thereby, the delay information file (corrected) 16 may be generated efficiently with a minimum amount of correction.

It is further preferable to add the minimum slack margin to a portion that is included only in the signal paths having the common end-side flip-flop. For example, the minimum slack margin may be added to delay time of data input terminal of the common end-side flip-flop. In this case, the added minimum slack margin has no influence on logical simulations of signal paths having other end-side flip-flops as end points.

Figure 4:
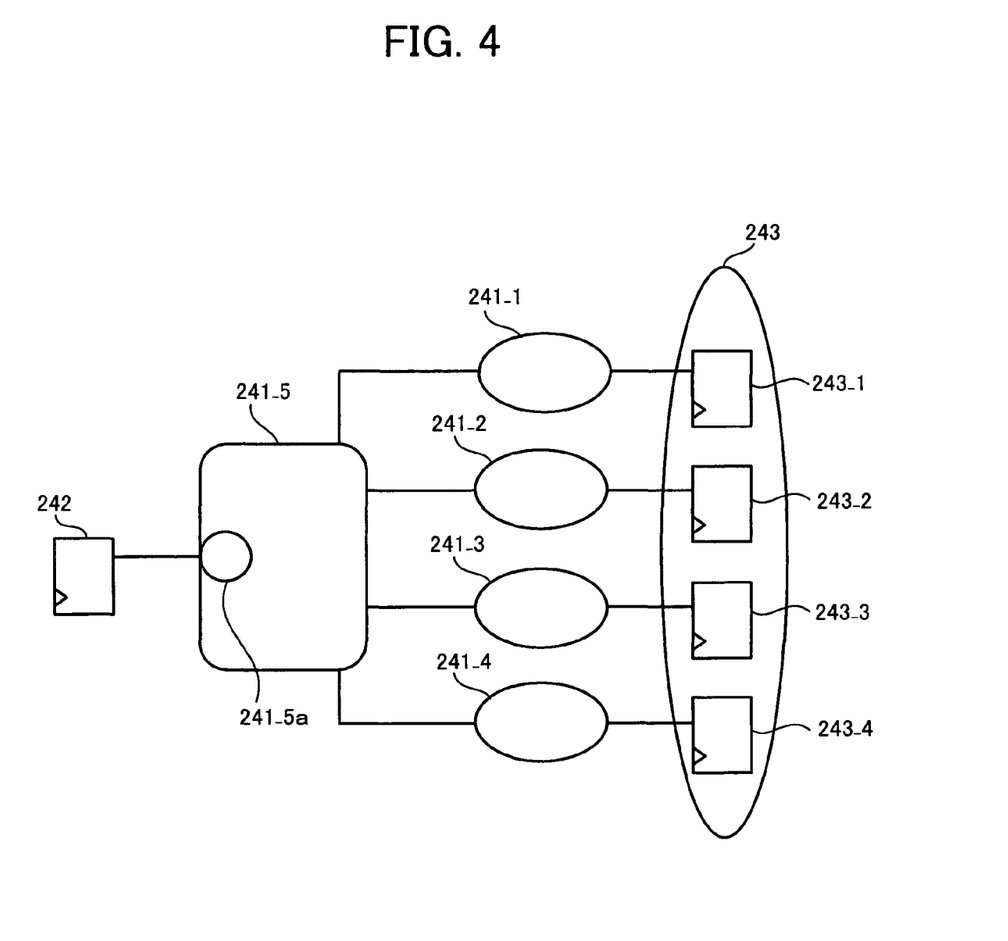
FIG. 4 is a schematic drawing showing a plurality of paths having a start-side flip-flop 242 as a common start-point.

FIG. 4 is a schematic drawing of a plurality of paths having a start-side flip-flop 242 as a common start-point. It is also possible to generate a test condition using the same procedure by considering a plurality of signal paths having a start-side flip-flop as a common start-point.

FIG. 4 shows a plurality of signal paths between the start-side flip-flop 242 and a plurality of end-point flip-flops 243 including end-side flip-flops 243_1, 243_2, 243_3, and 243_4. The paths starts from the common start-point flip-flop 242 and reaches to respective end-point flip-flops 243_1, 243_2, 243_3, and 243_4 through a common portion 241_5 of the user logic and further through respective portions 241_1, 241_2, 241_3, and 241_4 of the user logic. FIG. 4 also shows a delay fault 241_5a, which represents delay faults that may be detected by activating any one of the signal paths, exists in the portion 241_5 of the user logic commonly included in all of the paths.

In the example shown in FIG. 4, a delay fault, which exists at a portion commonly included in all of the plurality of signal paths, may be detected by activating any one of the plurality of signal paths. Accordingly, a difference between s delay time of the longest one of the four signal paths and the system timing is the "minimum slack margin". Here, a delay fault does not influence actual operations of the logic circuit at the system timing, if the size of the delay fault is smaller than the minimum slack margin.

Further, even in the case that the delay fault 241_5a exists at any positions other than the position shown in FIG. 4, the delay fault 241_5a does not influence the actual operations at the system timing within the area shown in FIG. 4, if the size of the delay fault is smaller than the minimum slack margin.

Accordingly, the minimum slack margin may be calculated as the difference between i) delay time of the longest one of the plurality of signal paths having the start-side flip-flop 242 as the common start-point and ii) the system timing. A logical simulation is performed for each of the signal paths activated by ATPG using delay times of the signal paths corrected by adding the calculated minimum slack margin, and end-side flip-flops included in failed signal paths as end-points are added in the failed FF list.

In the logical simulation, the minimum slack margin is preferably added to a portion commonly included in all of the signal paths having the common start-point. It is further preferable that the minimum slack margin is added to a portion included only in the signal paths having the common start-side flip-flop as the start-point. For example, the minimum slack margin may be added to delay time of output terminal of the start-side flip-flop.

What is claimed is:

1. A method of generating test conditions for detecting delay faults in a semiconductor integrated circuit that operates at a system timing, the method comprising:
generating a test pattern to be used in a test of a logic circuit in the semiconductor integrated circuit, the logic circuit including a plurality of signal paths having respective delay times through a combinational logic circuit between respective pluralities of start-side flip-flops and end-side flip-flops, the test pattern including a transition of a logical value of input data to be supplied to a first one of the start-side flip-flops that produces an expected transition of a logical value of output data supplied to a first one of the end-side flip-flops;
determining a minimum slack margin as a difference between the system timing and one of i) a longest one of the delay times of a first group of the signal paths from respective ones of the start-side flip-flops to the first one of the end-side flip-flops and ii) a longest one of the delay times of a second group of the signal paths from the first one of the start-side flip-flops to respective ones of the end-side flip-flops;
setting a test timing faster than the system timing;
simulating an operation of the logic circuit at the test timing using the test pattern and the delay times of the signal paths corrected by adding the minimum slack margin; and
storing the test pattern and the test timing in a test condition database including, when the simulating indicates that the output data after the expected transition is not acquired in the first one of the end-side flip-flops at the test timing, further storing mask data that masks data held in the first one of the end-side flip-flops in the test using the test pattern and the test timing in the test condition database.

2. The method according to claim 1, wherein:
the generating includes generating a second test pattern, the second test pattern includes a transition of a logical value of second input data to be supplied to a second one of the start-side flip-flops, different from the first one of the start-side flip-flops, that produces a second expected transition of a logical value of second output data supplied to a second one of the end-side flip-flops, different from the first one of the end-side flip-flops;
the determining includes determining a second minimum slack margin as a difference between the system timing and one of i) a longest one of the delay times of a third group of the signal paths from respective ones of the start-side flip-flops to the second one of the end-side flip-flops, and ii) a longest one the delay times of a fourth group of signal paths from the second one of the start-side flip-flops to respective ones of the end-side flip-flops; and
the simulating includes simulating a second operation of the logic circuit at the test timing using the second test pattern and the delay times of the signal paths corrected by adding the second minimum slack margin.

3. The method according to claim 1, wherein the delay times of the signal paths used in the simulating are corrected by adding the minimum slack margin to a delay time of a portion commonly included in all of one of the first and the second groups of signal paths.

4. The method according to claim 3, wherein the portion commonly included in all of the first group of signal paths is a data input terminal of the first one of the end-side flip-flops and the portion commonly included in all of the second group of signal paths is an output terminal of the first one of the start-side flip-flops.

5. The method according to claim 1, further comprising, after storing the test pattern and the mask data in the test condition database:
evaluating a ratio of the delay faults in the logic circuit detectable using the test pattern, the test timing, and the mask data stored in the test condition database; and
when the ratio is less than a target value:
setting a relaxed test timing faster than the system timing and slower than the test timing;
simulating a third operation of the logic circuit at the relaxed test timing using a third test pattern, which includes a transition of a logical value of third input data to be supplied to a third one of the start-side flip-flops that produces a third expected transition of a logical value of third output data supplied to a third one of the end-side flip-flops, and the delay times of the signal paths corrected by adding a third minimum slack margin, which is determined as a difference between the system timing and one of i) a longest one of the delay times of a fifth group of the signal paths from respective ones of the start-side flip-flops to the third one of the end-side flip-flops and ii) a longest one of the delay times of a sixth group of the signal paths from the third one of the start-side flip-flops to respective ones of the end-side flip-flops; and
storing the third test pattern and the relaxed test timing in the test condition database including, when the simulating indicates that the third output data after the third expected transition is not acquired in the third one of the end-side flip-flops at the relaxed test timing, further storing second mask data that masks data held in the third one of the end-side flip-flops in the test using the third test pattern and the relaxed test timing in the test condition database.

6. The method according to claim 5, wherein the third test pattern is the same as the test pattern.

7. The method according to claim 5, wherein the third test pattern activates a signal path having a delay fault other than those detectable by the test pattern, the test timing, and the mask data stored in the test condition database.

8. An apparatus for generating test conditions for detecting delay faults in a semiconductor integrated circuit that operates at a system timing, the apparatus comprising:
a test pattern generating block that generates a test pattern to be used in a test of a logic circuit in the semiconductor integrated circuit, the logic circuit including a plurality of signal paths having respective delay times through a combinational logic circuit between respective pluralities of start-side flip-flops and end-side flip-flops, the test pattern including a transition of a logical value of input data to be supplied to a first one of the start-side flip-flops that produces an expected transition of a logical value of output data supplied to a first one of the end-side flip-flops;
a minimum slack margin determining block that determines a minimum slack margin as a difference between the system timing and one of i) a longest one of the delay times of a first group of the signal paths from respective ones of the start-side flip-flops to the first one of the end-side flip-flops and ii) a longest one of the delay times of a second group of the signal paths from the first one of the start-side flip-flops to respective ones of the end-side flip-flops;

a test timing correcting block that sets a test timing faster than the system timing;

a simulation block that performs a simulation of an operation of the logic circuit at the test timing using the test pattern and the delay times of the signal paths corrected by adding the minimum slack margin; and a data storing block that stores the test pattern and the test timing in a test condition database, wherein the data storing block further stores, when the simulation indicates that the output data after the expected transition is not acquired in the first one of the end-side flip-flops at the test timing, a mask data that masks data held in the first one of the end-side flip-flops in the test using the test pattern and the test timing in the test condition database.

9. The apparatus according to claim 8, wherein:
the test pattern generating block further generates a second test pattern, the second test pattern includes a transition of a logical value of second input data to be supplied to a second one of the start-side flip-flops, different from the first one of the start-side flip-flops, that produces a second expected transition of a logical value of second output data supplied to a second one of the end-side flip-flops, different from the first one of the end-side flip-flops;

the minimum slack margin determining block further determines a second minimum slack margin as a difference between the system timing and one of i) a longest one of the delay times of a third group of the signal paths from respective ones of the start-side flip-flops to the second one of the end-side flip-flops, and ii) a longest one the delay times of a fourth group of signal paths from the second one of the start-side flip-flops to respective ones of the end-side flip-flops; and the simulation block further performs a simulation of a second operation of the logic circuit at the test timing using the second test pattern and the delay times of the signal paths corrected by adding the second minimum slack margin.

10. The apparatus according to claim 8, wherein the delay times of the signal paths used in the simulation are corrected by adding the minimum slack margin to a delay time of a portion commonly included in all of one of the first and the second groups of signal paths.

11. The method according to claim 10, wherein the portion commonly included in all of the first group of signal paths is a data input terminal of the first one of the end-side flip-flops and the portion commonly included in all of the second group of signal paths is an output terminal of the first one of the start-side flip-flops.

12. The apparatus according to claim 8, further comprising a detection ratio checking block that evaluates, after the data storing block stores the test pattern and the mask data in the test condition database, a ratio of the delay faults in the logic circuit detectable using the test pattern, the test timing, and the mask data stored in the test condition database,
wherein, when the evaluated ratio is less than a target value:
the test timing correcting block sets a relaxed test timing faster than the system timing and slower than the test timing;
the simulation block further performs a simulation of a third operation of the logic circuit at the relaxed test timing using a third test pattern, which includes a transition of a logical value of third input data to be supplied to a third one of the start-side flip-flops that produces a third expected transition of a logical value of third output data supplied to a third one of the end-side flip-flops, and the delay times of the signal paths corrected by adding a third minimum slack margin, which is determined as a difference between the system timing and one of i) a longest one of the delay times of a fifth group of the signal paths from respective ones of the start-side flip-flops to the third one of the end-side flip-flops and ii) a longest one of the delay times of a sixth group of the signal paths from the third one of the start-side flip-flops to respective ones of the end-side flip-flops; and the data storing block further stores the third test pattern and the relaxed test timing in the test condition database, wherein the data storing block further stores, when the simulation indicates that the third output data after the third expected transition is not acquired in the third one of the end-side flip-flops at the relaxed test timing, a second mask data that masks data held in the third one of the end-side flip-flops in the test using the third test pattern and the relaxed test timing in the test condition database.

13. The apparatus according to claim 12, wherein the third test pattern activates a signal path having a delay fault other than those detectable by the test pattern, the test timing, and the mask data stored in the test condition database.

14. An apparatus for evaluating a test condition for a faster-than-at-speed test of a semiconductor integrated circuit that operates at a system timing, the apparatus comprising:
a test pattern generating block that generates a test pattern to be used in a test of a logic circuit in the semiconductor integrated circuit, the logic circuit including a plurality of signal paths having respective delay times through a combinational logic circuit between respective pluralities of start-side flip-flops and end-side flip-flops, the test pattern including a transition of a logical value of input data to be supplied to a first one of the start-side flip-flops that produces an expected transition of a logical value of output data supplied to a first one of the end-side flip-flops;

a minimum slack margin determining block that determines a minimum slack margin as a difference between the system timing and one of i) a longest one of the delay times of a first group of the signal paths from respective ones of the start-side flip-flops to the first one of the end-side flip-flops and ii) a longest one of the delay times of a second group of the signal paths from the first one of the start-side flip-flops to respective ones of the end-side flip-flops;

a test timing correcting block that sets a test timing faster than the system timing; and a simulation block that performs a simulation of an operation of the logic circuit at the test timing using the test pattern and the delay times of the signal paths corrected by adding the minimum slack margin, wherein the simulation block determines that an overkill occurs in the test using the test pattern and the test timing when the simulation indicates that the output data after the expected transition is not acquired in the first one of the end-side flip-flops at the test timing.

15. The apparatus according to claim 14, wherein:
the test pattern generating block further generates a second test pattern, the second test pattern includes a transition of a logical value of second input data to be supplied to a second one of the start-side flip-flops, different from the first one of the start-side flip-flops, that produces a second expected transition of a logical value of second output data supplied to a second one of the end-side flip-flops, different from the first one of the end-side flip-flops;

the minimum slack margin determining block further determines a second minimum slack margin as a difference between the system timing and one of i) a longest one of the delay times of a third group of the signal paths from respective ones of the start-side flip-flops to the second one of the end-side flip-flops, and ii) a longest one the delay times of a fourth group of signal paths from the second one of the start-side flip-flops to respective ones of the end-side flip-flops; and the simulation block further simulates a second operation of the logic circuit at the test timing using the second test pattern and the delay times of the signal paths corrected by adding the second minimum slack margin.

16. The apparatus according to claim 14, wherein the delay times of the signal paths used in the simulation are corrected by adding the minimum slack margin to a delay time of a portion commonly included in all of one of the first and the second groups of signal paths.

17. The method according to claim 16, wherein the portion commonly included in all of the first group of signal paths is a data input terminal of the first one of the end-side flip-flops and the portion commonly included in all of the second group of signal paths is an output terminal of the first one of the start-side flip-flops.

* * * * *